United States Patent [19]

Magdo et al.

[11] 3,904,454

[45] Sept. 9, 1975

[54] METHOD FOR FABRICATING MINUTE OPENINGS IN INSULATING LAYERS DURING THE FORMATION OF INTEGRATED CIRCUITS

[75] Inventors: Ingrid E. Magdo; Steven Magdo, both of Hopewell Junction, N.Y.

[73] Assignee: IBM Corporation, Armonk, N.Y.

[22] Filed: Dec. 26, 1973

[21] Appl. No.: 427,888

[52] U.S. Cl. .................... 156/11; 148/187; 156/13; 156/17

[51] Int. Cl.$^2$...H01L 21/283; H01L 21/312; H01L 21/316

[58] Field of Search ............... 148/187; 96/35, 36.2; 156/11, 13, 17; 117/215

[56] References Cited

UNITED STATES PATENTS

| | | | |
|---|---|---|---|
| 3,388,000 | 6/1968 | Waters et al. | 148/187 |
| 3,390,025 | 6/1968 | Strieter | 148/187 |
| 3,479,237 | 11/1969 | Bergh et al. | 148/187 |
| 3,660,735 | 5/1972 | McDougall | 148/187 |
| 3,717,514 | 2/1973 | Burgess | 148/187 |
| 3,728,167 | 4/1973 | Garber | 148/187 |
| 3,800,412 | 4/1974 | Wall et al. | 148/187 |

*Primary Examiner*—Charles E. Van Horn
*Assistant Examiner*—Jerome W. Massie
*Attorney, Agent, or Firm*—J. B. Kraft

[57] ABSTRACT

A method in the fabrication of integrated circuits for forming small openings through electrically insulative passivating layers on semiconductor surfaces. First and second layers of different insulative material are formed on the semiconductor surface. Then, a first slot extending through the second or top layer is formed by chemical etching through an etch-resistant mask with an etchant which selectively etches the material in the top layer. The top layer is then covered with a photoresist mask having a second slot which crosses the first slot, and the structure is subjected to chemical etching through the photoresist mask with an etchant that selectively etches the material in the first or bottom layer to, thereby, form a small opening through this bottom layer which is defined by the intersecting portions of the first and second slots.

9 Claims, 11 Drawing Figures

METHOD FOR FABRICATING MINUTE OPENINGS IN INSULATING LAYERS DURING THE FORMATION OF INTEGRATED CIRCUITS

BACKGROUND OF INVENTION

The present invention relates to a method for forming openings utilizable in the fabrication of integrated circuits, and more particularly, to such a method which may be used to form relatively minute openings in insulative layers used to passivate and protect semiconductor substrates.

There has been a continuing trend in the integrated circuit field towards denser and denser large scale integrated circuits. As a result of this densification in the number of circuits and devices on integrated circuit chips, there is a need for methods of forming minute openings through insulative layers, which openings can either function as apertures through which conductivity-determining impurities may be introduced into the substrate or in which metal contacts or interconnections may be made through insulative layers.

The prior art as exemplified by U.S. Pat. No. 3,390,025 has recognized the need for methods for forming such minute openings. The prior art has further recognized that with openings having dimensions in the order of 0.1 mil per side or less, the limits of resolution in conventional photoresist masks may result in irregularities in the shape and size of the openings. In particular, when the openings are to be rectangular or square, there is a tendency towards rounded corners with openings of such minute dimensions. Because the openings are already so minute, any further reduction in their dimensions because of such rounded corners can give rise to serious fabrication and circuit operation problems.

The prior art has proposed a solution to this problem by forming, through conventional photoresist etching techniques, a pair of elongated slots respectively in a pair of passivating layers. These slots which cross each other each have a width corresponding to approximately the desired width of the opening to be formed. The slots cross each other in a manner such that the opening through the layers is formed only in the area common to both slots. Since the length of the slots is comparatively large with respect to the width of the slots, the art recognized that it is possible to intersect a pair of slots with a high degree of resolution. Accordingly, distortions and irregularities in the opening formed thereby should be eliminated. There have been two variations of this crossing slot approach in the prior art. The first as exemplifed by the above-referred to U.S. Pat. No. 3,390,025, initially forms a relatively thick layer of silicon dioxide on a substrate and etches a narrow slot through the thick layer. Subsequently, a second or thin layer of silicon dioxide is applied over the entire structure including the slot. Then, again with conventional photoresist techniques, a similar narrow slot intersecting the first slot is formed. However, the time of etching is only sufficient to etch through the thin layer of silicon dioxide but insufficient to etch through the thick layer. Thus, the final aperture is only etched completely through that portion of the thin layer in the slot which is at the intersection of the two elongated slots. While this thick-thin silicon dioxide masking approach does go part-way in solving the resolution problem for minute openings, it still has some potential problems. Because of the minute size of the opening, it is essential that the oxide be completely removed from the opening area. This necessitates extended etch time in order to insure such removal of the thin oxide. Because of such extended etch times, the thick oxide regions bordering the opening may be subject to deterioration which will introduce some distortion into the dimensions of the opening being formed.

A second approach involving this crossing slot procedure which avoids the above-described problems of the thick-thin silicon dioxide process is exemplified by U.S. Pat. No. 3,388,000. In this approach, the first narrow slot is formed in a bottom insulative material such as silicon dioxide. Subsequently, a second layer of a different insulative material of different etch characteristics is deposited over the structure and, consequently, in the first slot. Then, when the second intersecting elongated slot is formed through the second insulative layer, an etchant is used which selectively etches only the second insulative material and does not substantially affect the first insulative material. As a result, the first insulative layer does not deteriorate, and the potential problems of the thick-thin oxide approach are avoided.

Unfortunately, we have recognized that even the second approach has its potential problems. With this second approach, a final structure is obtained in which two different kinds of electrically insulative passivating layers are in direct contact with the semiconductor substrate, e.g., the combination of silicon dioxide and aluminum oxide. In order to have the minimum stress between the semiconductor substrate and the insulative layer on the substrate, it is very advantageous to have the same insulative material in contact with the entire semiconductor substrate, and especially when this insulative material is silicon dioxide. Because of the structural compatibility of silicon dioxide with the underlying semiconductor substrate, stresses are minimized where the semiconductor substrate is in contact with only silicon dioxide over its entire surface.

SUMMARY OF THE INVENTION

It is a primary object of the present invention to provide an improved process for forming minute openings through insulative layers in integrated circuit structures.

It is another object of the present invention to provide an improved process for forming such minute apertures by an intersecting slot technique which avoids the potential distortion problem of the thick-thin oxide technique.

It is yet another object of the present invention to provide a process for forming such apertures by an intersecting slot technique wherein only a single insulative material remains in contact with the entire semiconductor surface in the final structure.

In accordance with the present invention, in the fabrication of integrated circuits, there is provided a method for forming minute openings through electrically insulative passivating layers comprising the following steps. A first layer of a first electrically insulative material is formed over a semiconductor substrate, after which a second layer of a second electrically insulative material which is different in composition from the first material is formed on the first layer. Then, a first slot extending through the second or top layer is formed by chemical etching through an etch resistant mask with an etchant which selectively etches the second material. The second layer is covered with a photoresist mask having a second slot which crosses the first slot, after which the structure is subjected to chemical etching through said photoresist mask with an etchant which selectively etches the first material to thereby form a small opening through the first or bottom layer defined by the intersecting portions of the first and second slots.

Best results are obtained by utilizing silicon dioxide as the first insulative material and silicon nitride as the second insulative material.

With the method of the present invention, the thick-thin oxide approach with its attendant problems is avoided. In addition, in the final structure, the first or bottom insulative layer which may preferably be silicon dioxide remains in contact with the entire substrate; the second insulative material is not in contact with the substrate at any point.

The foregoing and other objects, features and advantages of the invention will be apparent from the following more particular description and preferred embodiments of the invention as illustrated in the accompanying drawings.

BRIEF DESCRIPTION OF THE DRAWINGS

With reference to FIG. 1, the procedure to be described will involve the formation of an opening having dimensions of 0.1 mils on a side by a method which involves intersecting masking slots 10 and 11 shown in phantom lines. The aperture 12 which is to be formed at the intersection of slots 10 and 11 will be formed through a passivating insulative layer 14, shown in phantom lines, to silicon substrate 13. FIGS. 1A–1D disclose the steps in the formation of this aperture along a structure viewed in sectional view at a position corresponding to line 1A—1A in FIG. 1. With reference to FIG. 1A, a minute opening with dimensions in the order of 0.1 mil per side is to be formed through an insulative layer to emitter region 15 in semiconductor substrate 13. First, at the fabrication stage at which the minute opening is to be formed, the continuous layer of silicon dioxide 16 is formed over the whole surface of the integrated circuit substrate. This silicon dioxide layer may be formed by thermal oxidation of the surface of substrate 13 in the conventional manner if the substrate is silicon. A conventional oxidation of the silicon substrate involves placing the substrate at an elevated temperature in the order of 970°C with or without the addition of water. Silicon dioxide layer 16 may also be formed by a conventional pyrolytic deposition or by sputter deposition. Silicon dioxide layer 16 may also be formed by a combination of pyrolytic deposition and thermal oxidation. Layer 16 has a thickness in the order of 2500A.

A layer 17 of an electrically insulative material having different chemical etch resistance characteristics than layer 16 is deposited on layer 16. In the present embodiment, layer 17 is silicon nitride. Aluminum oxide may also be used. The silicon nitride layer 17 may be deposited by any conventional pyrolytic deposition techniques or by cathode sputtering. One convenient pyrolytic technique involves the reaction of silane and ammonium or other nitrogen-containing compound. Layer 17 has a thickness in the order of 1600A.

Figure 1:
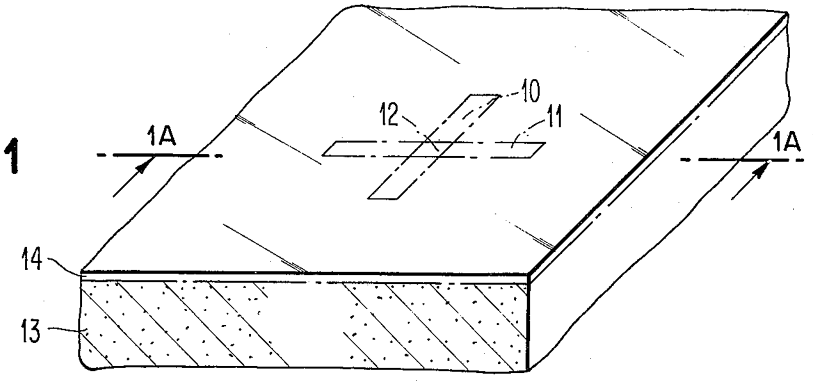
FIG. 1 is a fragmentary pictorial view of a section of a semiconductor substrate wherein a minute opening is to be formed through the insulative layers on the surface by an intersecting slot technique involving the intersection of the two slots shown in phantom lines.
Figure 1A:
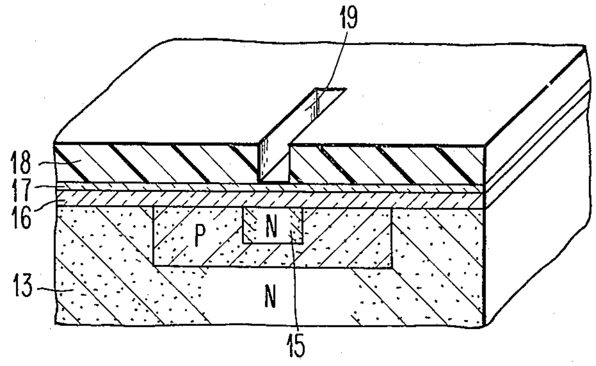
FIGS. 1A–1D are pictorial views in sections of the structure shown in FIG. 1 taken along line 1A—1A at various stages in processing.

Next, as shown in FIG. 1A, using standard photolithographic techniques, a photoresist mask 18 having a slot 19 corresponding in location and dimensions, 0.3 mil × 0.1 mil, to slot 10 is formed over silicon nitride layer 17. For the purposes of the present illustration, photoresist mask 18 is a positive photoresist. Such positive photoresists include photoresists described in U.S. Pat. Nos. 3,046,120 and 3,201,239; they include diazotype photoresists which change to developer soluble azo compounds in the areas exposed to light. In addition to such positive photoresists, conventional negative photoresists such as Kodak KTFR and KMER may be used.

Figure 1B:
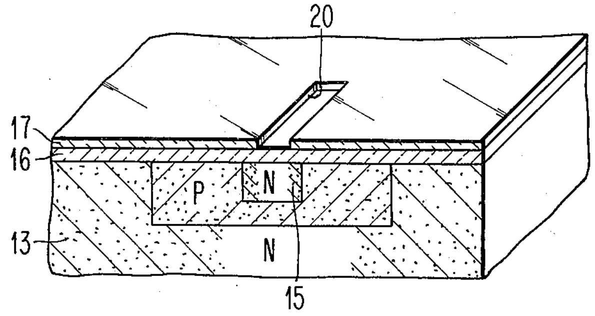

Then, using the photoresist mask 18 as an etch blocking mask, slot 20 corresponding in location and dimensions to slot 19 is etched through silicon nitride layer 17, FIG. 1B, with an etchant which selectively etches silicon nitride that has relatively little or no effect on the underlying layer 16 of silicon dioxide. A suitable etchant of this type is hot phospho salt, specifically having a composition of $(NH_4)_2HPO_4$ used at an application temperature of over 1850C. The dimensions of opening 20 are 0.1 mils by 0.4 mils. Photoresist mask 18 is then removed by conventional stripping.

Figure 1C:
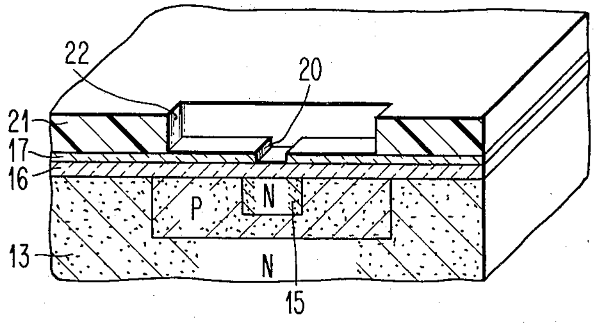

With reference to FIG. 1C, a second photoresist mask 21 having a slot 22 corresponding in location and dimensions to slot 11 is formed over silicon nitride layer 17 intersecting slot 20. Mask 21 is formed using the photolithographic techniques described above. It conveniently is of the same material as mask 18. Slot 22 has substantially the same dimensions as slot 20. Then, using an etchant which selectively etches silicon dioxide but has relatively little or no effect on the silicon nitride, opening 23 is etched through silicon dioxide layer 16, FIG. 1D, in the area where slots 20 and 22 intersect. A suitable etchant for this purpose is buffered hydrofluoric acid. Opening 23 will consequently have dimensions of 0.1 mils by 0.1 mils. Only layer 16 will remain in contact with substrate 13. At no point will silicon nitride layer 17 contact substrate 13. If $Si_3N_4$ is in touch with the silicon, it tends to introduce stress resulting in dislocation.

With reference to FIGS. 2A–2E, there will now be described a process for forming a minute aperture similar to that described in FIGS. 1A–1D except that there is an additional masking step wherein a silicon oxide layer is used as a mask in etching the slot through the underlying silicon nitride layer. The structure in FIG. 2A substantially corresponds to that in FIG. 1A except that an additional layer of silicon dioxide 24 is sandwiched between silicon nitride layer 25 and photoresist layer 26. Otherwise, the bottom layer of silicon dioxide layer 27 corresponds to layer 16 in FIG. 1A, and substrate 28 corresponds to substrate 13. Silicon dioxide layer 24 may be deposited on silicon nitride layer 23 in any conventional manner including sputter deposition or pyrolytic deposition. Layer 24 has a thickness in the order of 1000A.

Figure 2A:
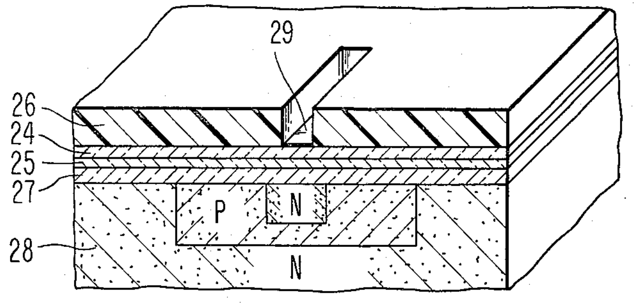
FIGS. 2A–2E are pictorial views in sections similar to those in FIGS. 1A–1D but of an alternative embodiment.
Figure 2B:
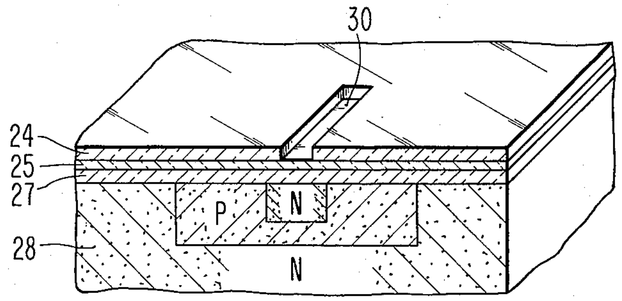
Figure 2C:
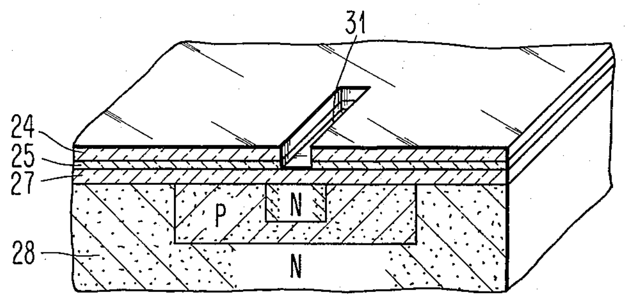

Using the photoresist mask, a slot 30 corresponding in dimension to slot 29 in photoresist mask 26 is etched through silicon dioxide layer 24, FIG. 2B. The etchant used is one which selectively etches silicon dioxide without any substantial effect on underlying silicon nitride layer 25. A suitable etchant for this purpose is the standard buffered hydrofluoric acid etchant conventionally used to etch silicon dioxide. Photoresist mask 26 is then removed by conventional stripping.

Then, utilizing silicon dioxide layer 24 as a mask, a slot 31 corresponding to slot 30 is etched through silicon nitride layer 25 with an etchant which selectively etches silicon nitride without effecting the overlying or underlying layers 24 and 27 of silicon dioxide; see FIG. 1C. Conventional etchants in the art for this purpose are hot phosphoric acid or hot phosphoric salts.

Figure 2D:
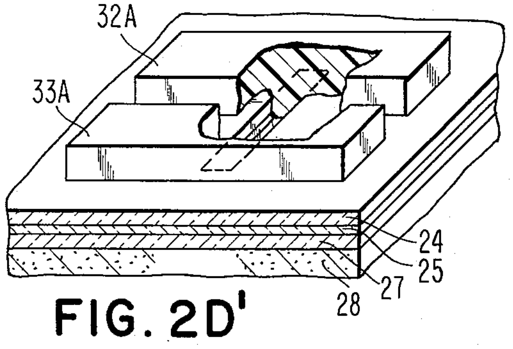
Figure 2D:
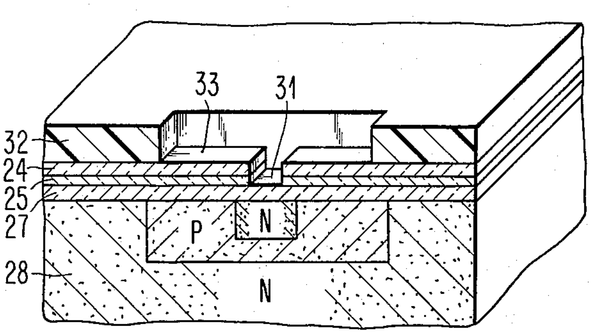

Then, as shown in FIG. 2D, a photoresist mask 32, substantially equivalent of photoresist mask 21, FIG. 1C, is formed with a slot 33 intersecting slot 31.

Figure 1D:
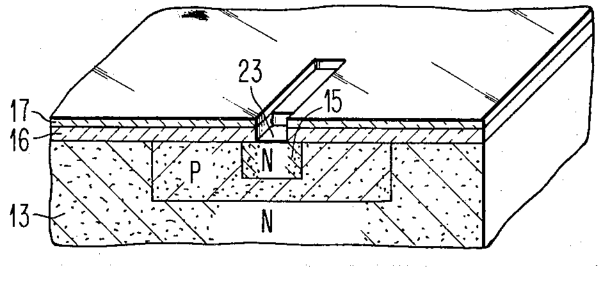
Figure 2E:
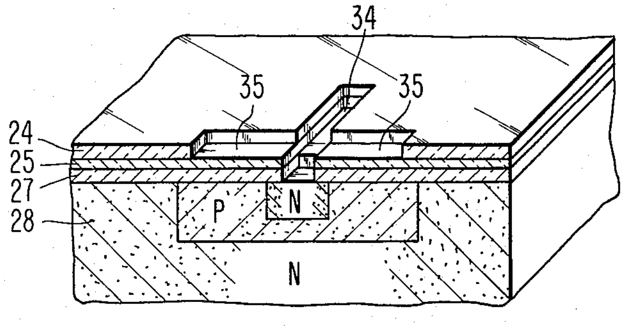

Then, in a process corresponding to that described with respect to FIG. 1C, an etchant which selectively etches silicon dioxide without any substantial effect on silicon nitride is applied to form an opening 34, as shown in FIG. 2E, which corresponds to opening 23 in FIG. 1D. A suitable etchant is the previously described buffered hydrofluoric acid solution. This etchant also removes portions 35 of the top layer of silicon dioxide 24 which are exposed within slot 33. However, underlying layer 25 of silicon nitride prevents any further etching under portions 35.

With respect to the step described in FIG. 2D, it should be noted that slot 33 need not be enclosed on all four sides. It is only necessary for slot 33 to be enclosed on the two sides needed to define the intersection between slots 33 and 31. Thus, the step shown in 2D' may be used in place of the step shown in 2D. The step is identical except that photoresist layer 32A does not enclose slot 33A on all four sides; slot 33A is enclosed only on the two sides which intersect slot 31.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In the fabrication of integrated circuits, a method comprising the steps of:

forming a first layer of a first electrically insulative material over a semiconductor substrate, forming a second layer of a second electrically insulative material on said first layer, forming, by chemical etching through an etch-resistant mask with an etchant which selectively etches said second material, a first slot extending through said second layer, removing said etch-resistant mask, covering said second layer with a photoresist mask having a second slot, a portion of which intersects and crosses only a portion of said first slot defined by the narrowest dimension of said second slot and thus forming an opening defined by said first slot and said second slot which has dimensions defined by the narrowest dimensions of the first and seconds slots, and removing, by chemical etching through said photoresist mask with an etchant which selectively etches said first material, a small opening through said first layer defined by the intersecting portions of said first and second slots.

2. The method of claim 1 wherein said etch-resistant mask is also a photoresist mask.

3. The method of claim 1 wherein said etch-resistant mask is made of an electrically insulative material.

4. The method of claim 3 wherein said etch-resistant mask is made of the same material as said first layer.

5. The method of claim 2 wherein said first insulative material is silicon dioxide and said second insulative material is silicon nitride.

6. The method of claim 4 wherein said first insulative material is silicon dioxide and said second insulative material is silicon nitride.

7. The method of claim 1 wherein said photoresist mask is in contact with said second layer.

8. In the fabrication of integrated circuits, a method comprising the steps of forming a first layer of a first electrically insulative material over a semiconductor substrate, forming a second layer of a second electrically insulative material on said first layer, forming a third layer of said first insulative material on said second layer, forming a first photoresist mask having a first slot on said third layer, forming, by chemical etching through said first photoresist mask with an etchant which selectively etches said first insulative material, a second slot extending through said third layer in registration with said first slot, forming, by chemical etching through said second slots with an etchant which selectively etches said second insulative material, a third slot extending through said second layer in registration with said second slot, removing said first photoresist mask, covering the third layer with a second photoresist mask having a fourth slot, a portion of which intersects and crosses only a portion of said second slot defined by the narrowest dimension of said fourth slot and thus forming an opening defined by said second slot and said fourth slot which has dimensions defined by the narrowest dimensions of said second and fourth slots, and removing, by chemical etching through said second photoresist mask with an etchant which selectively etches said first material, a small opening extending through said first layer defined by the intersecting portion of said second and fourth slots.

9. The method of claim 8, wherein said first insulative material is silicon dioxide and said second insulative material is silicon nitride.

* * * * *